(12) United States Patent
Iwata et al.

(10) Patent No.: US 12,284,861 B2
(45) Date of Patent: Apr. 22, 2025

(54) ELECTROLUMINESCENT ELEMENT AND ELECTROLUMINESCENT DEVICE EACH HAVING ELECTRON TRANSPORT LAYER INCLUDING N-TYPE SEMICONDUCTOR PARTICLES AND INSULATING POLYMER

(71) Applicant: SHARP KABUSHIKI KAISHA, Sakai (JP)

(72) Inventors: Noboru Iwata, Sakai (JP); Hisayuki Utsumi, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 541 days.

(21) Appl. No.: 17/642,794

(22) PCT Filed: Sep. 26, 2019

(86) PCT No.: PCT/JP2019/037968
§ 371 (c)(1),
(2) Date: Mar. 14, 2022

(87) PCT Pub. No.: WO2021/059452
PCT Pub. Date: Apr. 1, 2021

(65) Prior Publication Data
US 2022/0393130 A1    Dec. 8, 2022

(51) Int. Cl.
*H10K 50/16*    (2023.01)
*H10K 50/115*   (2023.01)
(Continued)

(52) U.S. Cl.
CPC .......... *H10K 50/16* (2023.02); *H10K 50/115* (2023.02); *H10K 50/125* (2023.02); *H10K 50/15* (2023.02)

(58) Field of Classification Search
CPC .... H10K 50/16; H10K 50/125; H10K 50/115; H10K 50/15
See application file for complete search history.

(56) References Cited

U.S. PATENT DOCUMENTS 9,768,404 B1 * 9/2017 Steckel ................ C09K 11/025
2005/0069726 A1 * 3/2005 Douglas ................ B82Y 20/00
428/323

(Continued)

FOREIGN PATENT DOCUMENTS

CN    107579159 A    1/2018
JP    2015128191 A   7/2015
(Continued)

*Primary Examiner* — Michael Jung
(74) *Attorney, Agent, or Firm* — ScienBiziP, P.C.

(57) ABSTRACT

An electroluminescent element including an anode, a cathode, and a light-emitting layer provided between the anode and the cathode, in which the electroluminescent element further includes an electron transport layer [[(33) including n-type semiconductor particles and a first insulating polymer, and a hole transport layer including p-type semiconductor particles, the electron transport layer is provided between the cathode and the light-emitting layer, the hole transport layer is provided between the anode and the light-emitting layer, and a volume proportion of the n-type semiconductor particles in the electron transport layer is smaller than a volume proportion of the p-type semiconductor particles in the hole transport layer.

19 Claims, 9 Drawing Sheets

(51) Int. Cl.
*H10K 50/125* (2023.01)
*H10K 50/15* (2023.01)

(56) References Cited

U.S. PATENT DOCUMENTS

| | | | |
|---|---|---|---|
| 2010/0283046 A1* | 11/2010 | Uchida | B82Y 20/00 |
| | | | 257/E51.027 |
| 2013/0200360 A1 | 8/2013 | Oikawa | |
| 2015/0228850 A1* | 8/2015 | Zheng | H01L 33/305 |
| | | | 257/13 |
| 2017/0221969 A1 | 8/2017 | Steckel et al. | |
| 2018/0190928 A1 | 7/2018 | Wang et al. | |
| 2019/0097151 A1* | 3/2019 | Lee | H10K 50/11 |
| 2019/0198796 A1* | 6/2019 | Kim | H10K 50/805 |
| 2019/0288230 A1* | 9/2019 | Kim | H10K 50/15 |
| 2020/0067005 A1* | 2/2020 | Park | H10K 85/115 |
| 2021/0167295 A1* | 6/2021 | Stubbs | C09K 11/70 |

FOREIGN PATENT DOCUMENTS

| | | |
|---|---|---|
| WO | 2009/084273 A1 | 7/2009 |
| WO | 2012/029750 A1 | 3/2012 |

* cited by examiner

«ELECTROLUMINESCENT ELEMENT AND ELECTROLUMINESCENT DEVICE EACH HAVING ELECTRON TRANSPORT LAYER INCLUDING N-TYPE SEMICONDUCTOR PARTICLES AND INSULATING POLYMER»

ELECTROLUMINESCENT ELEMENT AND ELECTROLUMINESCENT DEVICE EACH HAVING ELECTRON TRANSPORT LAYER INCLUDING N-TYPE SEMICONDUCTOR PARTICLES AND INSULATING POLYMER

TECHNICAL FIELD

The disclosure relates to an electroluminescent element and an electroluminescent device including a plurality of electroluminescent elements.

BACKGROUND ART

In recent years, various display devices have been developed. Particularly, a display device including an Organic Light Emitting Diode (OLD) and a display device including an inorganic light emitting diode or a Quantum dot Light Emitting Diode ((SLED) have drawn a great deal of attention because the devices are capable of achieving lower power consumption, smaller thickness, higher picture quality, and the like.

PTLs 1 to 3 disclose an electroluminescent element, such as an OLED or a QLED, which includes an electron transport layer including semiconductor nanoparticles (for example, metal oxide nanoparticles) or a hole transport layer.

(a) of FIG. 9, (b) of FIG. 9, (c) of FIG. 9, and (d) of FIG. 9 are diagrams illustrating schematic configurations of known electroluminescent elements 101, 102, 103, and 104 disclosed in PTLs 1 to 3.

The electroluminescent element 101 disclosed in PTL 1 illustrated in (a) of FIG. 9 has a structure in which an anode (anode electrode) 112, a hole transport layer 113, a light-emitting layer 114, a nanoparticle layer 115, and a cathode (cathode electrode) 116 are layered on a substrate 111 in this order from the substrate 111 side. In addition, the nanoparticle layer 115 is formed by applying a material in which nanoparticles of barium titanate are dispersed in a xylene solution as metal oxide nanoparticles (electron transport material) on the light-emitting layer 114 by a spraying method. PTL 1 discloses that electron injection into the light-emitting layer 114 is efficiently performed by providing the nanoparticle layer 115 between the light-emitting layer 114 and the cathode 116 (cathode electrode) in this manner.

The electroluminescent element 102 disclosed in PTL 1 illustrated in (b) of FIG. 9 has a structure in which the anode (anode electrode) 112, the hole transport layer 113, the light-emitting layer 114, a nanoparticle-containing film 117, and the cathode (cathode electrode) 116 are layered on the substrate 111 in this order from the substrate 111 side. In addition, the nanoparticle-containing film 117 is formed by applying a solution, which is obtained by dissolving and/or dispersing a mixture in xylene, onto the light-emitting layer 114 by a spraying method, the mixture containing polystyrene, which is a binder resin, and barium titanate at a weight ratio of 3:1 (polystyrene:barium titanate=3:1). In addition, it is disclosed that an electron transport material may be mixed into the binder resin, and a material having an ability to transport electrons is suitable as the binder resin. PTL 1 discloses that electron injection into the light-emitting layer 114 is efficiently performed by providing the nanoparticle-containing film 117 between the light-emitting layer 114 and the cathode (cathode electrode) 116 in this manner.

The electroluminescent element 103 disclosed in PTL 2 illustrated in (c) of FIG. 9 has a structure in which an anode (anode electrode) 122, a hole injection layer 123, a hole transport layer 124, a light-emitting layer 125, an electron transport layer 126, an electron injection layer 127, and a cathode (cathode electrode) 128 are layered on the substrate 121 in this order from a substrate 121 side. In addition, the hole transport layer 124 contains semiconductor nanoparticles 129, and the surface of the hole transport layer 124 has an uneven structure. According to PTL 2, it is disclosed that the hole transport layer 124 contains the semiconductor nanoparticles 129 in this manner, and thus it is possible to improve the hole transport property. In addition, the surface of the hole transport layer 124 has an uneven structure, and thus it is possible to efficiently perform hole injection due to electric field concentration at the interface having irregularities.

The electroluminescent element 104 disclosed in PTL 3 illustrated in (d) of FIG. 9 has a structure in which an anode (anode electrode) 132, an organic functional layer 150, and a cathode (cathode electrode) 138 are layered on a flexible support substrate 131 in this order from the flexible support substrate 131 side. The organic functional layer 150 includes a hole injection layer 133, a hole transport layer 134, a light-emitting layer 135, an electron transport layer 136, and an electron injection layer 137. The hole injection layer 133, the hole transport layer 134, the light-emitting layer 135, the electron transport layer 136, and the electron injection layer 137 are layered in this order from the anode (anode electrode) 132 side. In addition, the anode (anode electrode) 132, the organic functional layer 150, and the cathode (cathode electrode) 138 on the flexible support substrate 131 are sealed by a flexible sealing member 140 via a sealing adhesive 139. In addition, the electron transport layer 136 includes an electron transport material and semiconductor nanoparticles 141. PTL 3 discloses that the electron transport layer 136 includes the electron transport material and the semiconductor nanoparticles 141 in this manner, and thus a decrease in light emission luminance and an increase in a startup voltage are suppressed even when the thickness of the light-emitting layer 135 or the electron transport layer 136 is increased.

CITATION LIST

Patent Literature

PTL 1: WO 2009/084273 A1 (published Jul. 9, 2009)
PTL 2: WO 2012/029750 A1 (published Mar. 8, 2012)
PTL 3: JP 2015-128191 A (published Jul. 9, 2015)

SUMMARY

Technical Problem

However, the electroluminescent element 101 disclosed in PTL 1 illustrated in (a) of FIG. 9 includes the nanoparticle layer 115 without the balance between the number of holes and the number of electrons which are injected into the light-emitting layer 114 being considered at all. Thus, a state of having an excess number of electrons compared with those originally present in the light-emitting layer 114 is caused, and it is not possible to realize efficient light emission with well-balanced holes and electrons in the light-emitting layer 114.

Further, in the case of the electroluminescent element 102 disclosed in PTL 1 illustrated in (b) of FIG. 9, it is disclosed that the nanoparticle-containing film 117 uses a mixture of polystyrene, which is a binder resin, and barium titanate at a weight ratio of 3:1 (polystyrene:barium titanate=3:1). However, the balance between the number of holes and the number of electrons which are injected into the light-emitting layer 114 is not considered at all, and thus there is no description regarding what level of hole transport property is required for the hole transport layer 113 with respect to the electron transport property of the nanoparticle-containing film 117. Further, in the case of the electroluminescent element 102 disclosed in PTL 1, it is disclosed that an electron transport material may be mixed into the binder resin, and a material having an electron transport property is suitable as the binder resin. Thus, similarly to the electroluminescent element 101 described above, a state of having an excess number of electrons compared with those originally present in the light-emitting layer 114 is caused, and it is not possible to realize efficient light emission with well-balanced holes and electrons in the light-emitting layer 114.

In addition, in the case of the electroluminescent element 103 disclosed in PTL 2 illustrated in (c) of FIG. 9, it is disclosed that the hole transport layer 124 contains the semiconductor nanoparticles 129. However, the balance between the number of holes and the number of electrons which are injected into the light-emitting layer 125 is not considered at all, and thus there is no description regarding what level of electron transport property is required for the electron transport layer 126 with respect to the hole transport property of the hole transport layer 124 containing the semiconductor nanoparticles 129. Further, there is no description about using an insulating polymer in the electron transport layer 126 to reduce the electron transport property. Thus, it is not possible to realize efficient light emission with well-balanced holes and electrons in the light-emitting, layer 125.

Further, the electroluminescent element 104 disclosed in PTL 3 illustrated in (d) of FIG. 9 includes the electron transport layer 136 including the electron transport material and the semiconductor nanoparticles 141 without considering the balance between the number of holes and the number of electrons which are injected into the light-emitting layer 135 at all. Thus, a state of having an excess number of electrons compared with those originally present in the light-emitting layer 135 is caused, and it is not possible to realize efficient light emission with well-balanced holes and electrons in the light-emitting layer 135.

An aspect of the disclosure has been made in view of the above-mentioned issue, and an object of the disclosure is to provide an electroluminescent element in which efficient light emission is realized with well-balanced holes and electrons in a light-emitting layer, and an electroluminescent device including a plurality of electroluminescent elements.

Solution to Problem

In order to solve the problem described above, an aspect of an electroluminescent element of the disclosure is an electroluminescent element including an anode, a cathode, and a light-emitting layer provided between the anode and the cathode, in which the electroluminescent element further includes an electron transport layer including n-type semiconductor particles and a first insulating polymer, and a hole transport layer including p-type semiconductor particles, the electron transport layer is provided between the cathode and the light-emitting layer, the hole transport layer is provided between the anode and the light-emitting layer, and a volume proportion of the n-type semiconductor particles in the electron transport layer is smaller than a volume proportion of the p-type semiconductor particles in the hole transport layer.

In order to solve the problem described above, an aspect of an electroluminescent device of the disclosure includes the electroluminescent element.

In order to solve the problem described above, an aspect of an electroluminescent device of the disclosure is an electroluminescent device including a first electroluminescent element and a second electroluminescent element, in which the first electroluminescent element includes a first anode, a first cathode, a first light-emitting layer provided between the first anode and the first cathode, a first hole transport layer including first p-type semiconductor particles, the first hole transport layer being provided between the first anode and the first light-emitting layer, and a first electron transport layer including first n-type semiconductor particles and a first insulating polymer, the first electron transport layer being provided between the first cathode and the first light-emitting layer, a volume proportion of the first n-type semiconductor particles in the first electron transport layer is smaller than a volume proportion of the first p-type semiconductor particles in the first hole transport layer, the second electroluminescent element includes a second anode, a second cathode, a second light-emitting layer having a shorter light emission wavelength than the first light-emitting layer, the second light-emitting layer being provided between the second anode and the second cathode, a second hole transport layer including second p-type semiconductor particles, the second hole transport layer being provided between the second anode and the second light-emitting layer, and a second electron transport layer including second n-type semiconductor particles and a third insulating polymer, the second electron transport layer being provided between the second cathode and the second light-emitting layer, a volume proportion of the second n-type semiconductor particles in the second electron transport layer is smaller than a volume proportion of the second p-type semiconductor particles in the second hole transport layer, and a volume proportion of the second n-type semiconductor particles in the second electron transport layer is larger than a volume proportion of the first n-type semiconductor particles in the first electron transport layer.

Advantageous Effects of Disclosure

According to an aspect of the disclosure, it is possible to provide an electroluminescent element in which efficient light emission is realized with well-balanced holes and electrons in a light-emitting layer, and an electroluminescent device including a plurality of electroluminescent elements.

Figure 9:
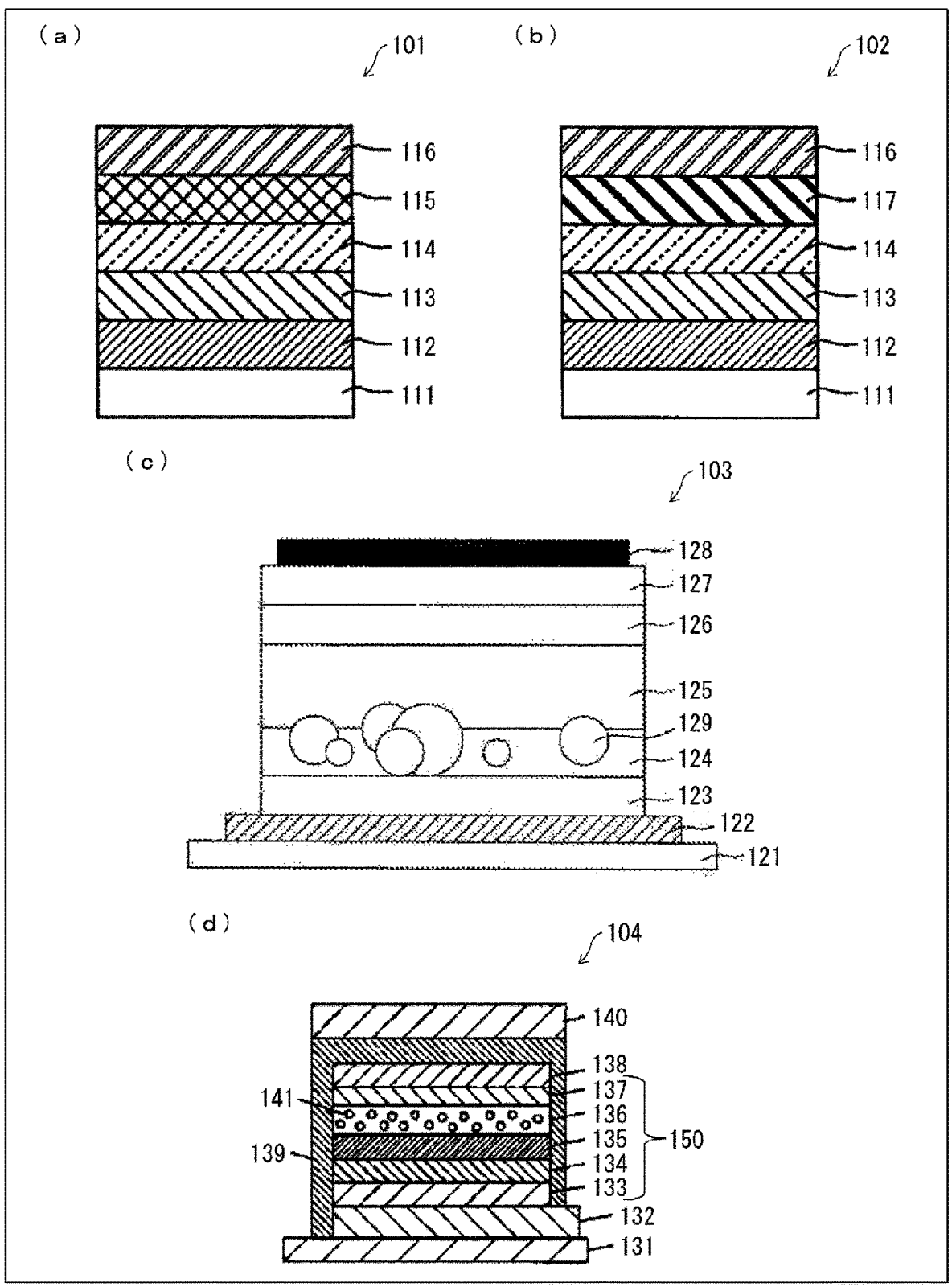

(a) of FIG. 9, (b) of FIG. 9, (c) of FIG. 9, and (d) of FIG. 9 are diagrams illustrating schematic configurations of known electroluminescent elements disclosed in PTLs 1 to 3.

DESCRIPTION OF EMBODIMENTS

Embodiments of the disclosure will be described with reference to FIGS. 1 to 8 as follows. Hereinafter, for convenience of explanation, components having the same functions as those described in a specific embodiment have the same reference signs appended thereto, and descriptions thereof may be omitted.

In the following embodiments of the disclosure, an example of a display device will be described as an electroluminescent device including a plurality of electroluminescent elements and a control circuit that controls light emission of each of the plurality of electroluminescent elements. However, the disclosure is not limited thereto, and examples thereof may include an illumination device including a plurality of electroluminescent elements and a control circuit controlling light emission of each of the plurality of electroluminescent elements, and the like.

First Embodiment

A first embodiment of the disclosure will be described with reference to FIGS. 1 to 5.

Figure 1:
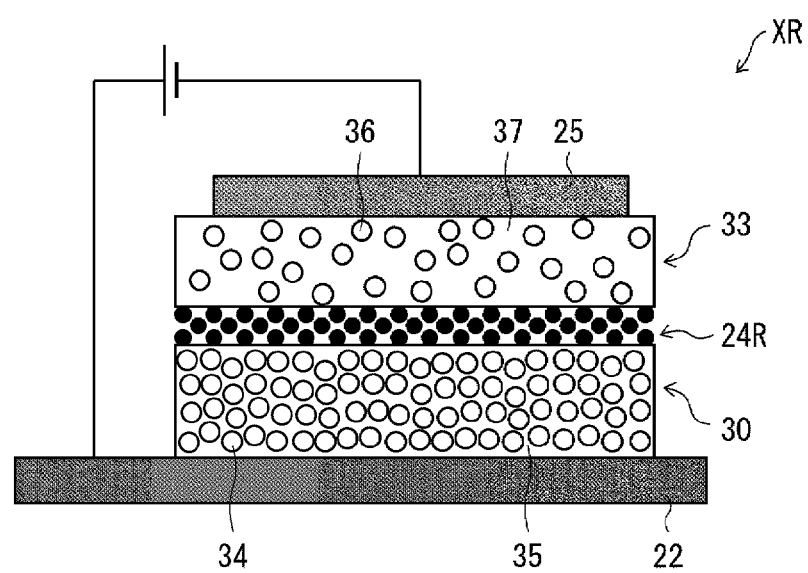
FIG. 1 is a diagram illustrating a schematic configuration of an electroluminescent element according to a first embodiment.

FIG. 1 is a diagram illustrating a schematic configuration of an electroluminescent element XR according to a first embodiment.

Figure 2:
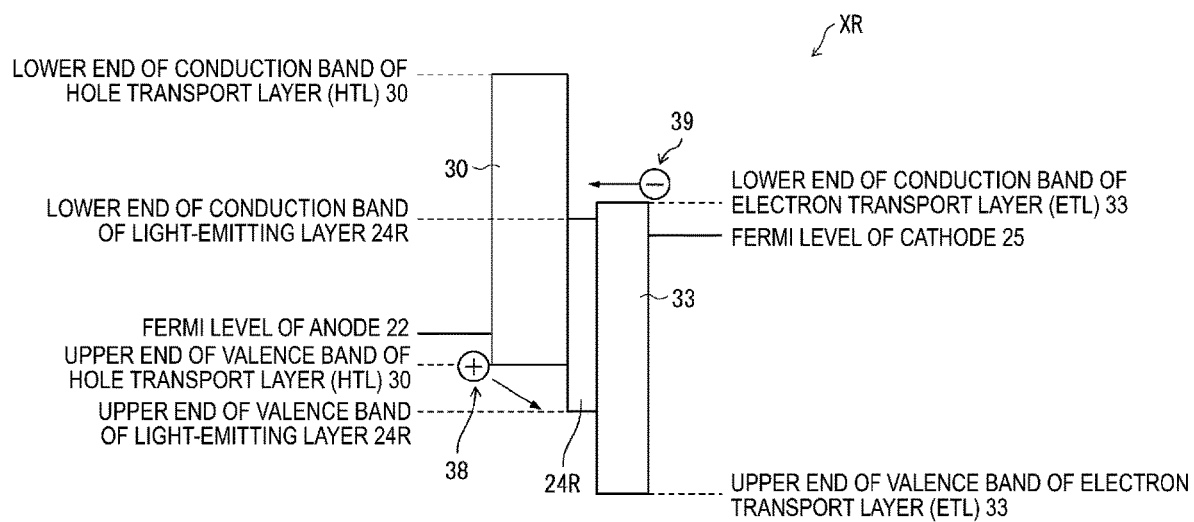
FIG. 2 is an energy band diagram of the electroluminescent element illustrated in FIG. 1.

FIG. 2 is an energy band diagram of the electroluminescent element XR illustrated in FIG. 1.

The electroluminescent element XR illustrated in FIG. 1 includes an anode (anode electrode) 22, a cathode (cathode electrode) 25, and a light-emitting layer 24 (first light-emitting layer) R including quantum dots provided between the anode (first anode) 22 and the cathode (first cathode) 25. Here, a case where the electroluminescent element includes the light-emitting layer 24R that emits light in a red wavelength region is described as an example. However, the disclosure is not limited thereto, and the wavelength region of emitted light is not particularly limited, and may be, for example, a light-emitting layer that emits light in a green wavelength region or may be a light-emitting layer that emits light in a blue wavelength region. Note that, in the present embodiment, a Quantum dot Light Emitting Diode (QLED) that includes a light-emitting layer including quantum dots is described as an example of an electroluminescent element. However, the disclosure is not limited thereto, and the electroluminescent element may be an Organic Light Emitting Diode (OLED) including a light-emitting layer that does not include quantum dots, an inorganic light emitting diode, or the like as long as the electroluminescent element emits light by electrons and holes being inserted thereinto.

As illustrated in FIG. 1, the electroluminescent element XR further includes an electron transport layer (first electron transport layer) 33 including n-type semiconductor particles (first n-type semiconductor particles) 36 and a first insulating polymer 37, and a hole transport layer (first hole transport layer) 30 including p-type semiconductor particles (first p-type semiconductor particles) 34. Note that, in the present embodiment, a case where the hole transport layer including p-type semiconductor particles 34 and the second insulating polymer 35 is used as the hole transport layer 30 including the p-type semiconductor particles 34 is described as an example. However, the disclosure is not limited thereto, and a hole transport layer including only the p-type semiconductor particles 34 may be used as the hole transport layer 30 including the p-type semiconductor particles 34.

The electron transport layer 33 is provided between the cathode 25 and the light-emitting layer 24R, and the hole transport layer 30 is provided between the anode 22 and the light-emitting layer 24R. Further, in the electroluminescent element XR, a volume proportion of the n-type semiconductor particles 36 in the electron transport layer 33 is smaller than a volume proportion of the p-type semiconductor particles 34 in the hole transport layer 30.

The volume proportion of the n-type semiconductor particles 36 in the electron transport layer 33 can be obtained by (the entire volume of the n-type semiconductor particles 36/the entire volume of the electron transport layer 33)× 100%, and the volume proportion of the p-type semiconductor particles 34 in the hole transport layer 30 can be obtained by (the entire volume of the p-type semiconductor particles 34/the entire volume of the hole transport layer 30) 100%.

Note that, in the present embodiment, a case where inorganic nanoparticles consisting of, for example, zinc oxide (for example, ZnO) which are electron-transporting inorganic nanoparticles, are used as the n-type semiconductor particles 36 is described as an example. However, the disclosure is not limited thereto, and any one of, for example, inorganic nanoparticles consisting of titanium oxide (for example, $TiO_2$), inorganic nanoparticles consisting of indium oxide (for example, $In_2O_3$), inorganic nanoparticles consisting of gallium oxide (for example, $Ga_2O_3$), inorganic nanoparticles consisting of tin oxide (for example, $SnO_2$), inorganic nanoparticles consisting of zinc sulfide (for example, ZnS), inorganic nanoparticles consisting of zinc telluride (for example, ZnTe), inorganic nanoparticles consisting of vanadium oxide (for example, $V_2O_5$), inorganic nanoparticles consisting of molybdenum oxide (for example, $MoO_3$), inorganic nanoparticles consisting of tungsten oxide (for example, $WO_3$), and inorganic nanoparticles consisting of gallium nitride (for example, GaN) may be used as long as the inorganic nanoparticles are electron-transporting inorganic nanoparticles. Further, as the n-type semiconductor particles 36, for example, inorganic nanoparticles consisting of a mixture containing two or more types among zinc oxide, titanium oxide, indium oxide, gallium oxide, tin oxide, zinc sulfide, zinc telluride, vanadium oxide, molybdenum oxide, tungsten oxide, and gallium nitride may be used. Further, a plurality of types among, for example, inorganic nanoparticles consisting of zinc oxide, inorganic nanoparticles consisting of titanium oxide, inorganic nanoparticles consisting of indium oxide, inorganic nanoparticles consisting of gallium oxide, inorganic nanoparticles consisting of tin oxide, inorganic nanoparticles consisting of zinc sulfide, inorganic nanoparticles consisting of zinc telluride, inorganic nanoparticles consisting of vanadium oxide, inorganic nanoparticles consisting of molybdenum oxide, inorganic nanoparticles consisting of tungsten oxide, and inorganic nanoparticles consisting of gallium nitride may be used.

Note that, although the particle size of the n-type semiconductor particles 36 in the electron transport layer 33 is not particularly limited, the particle size is preferably equal to or greater than 1 nm from the viewpoint of suppressing aggregation of particles, and the particle size is preferably equal to or less than 30 nm from the viewpoint of reducing the surface roughness of the electron transport layer 33 and the surface roughness of the electroluminescent element XR. Thus, in the present embodiment, inorganic nanoparticles consisting of zinc oxide (for example, ZnO) having a particle size of 12 nm are used as the n-type semiconductor particles 36.

Further, the particle size of the n-type semiconductor particles 36 is preferably equal to or greater than 1 nm and equal to or less than 10 nm from the viewpoint of expressing a quantum size effect, improving electron injection efficiency, and obtaining an effect of blocking holes which are counter carriers.

In addition, as the first insulating polymer 37 of the electron transport layer 33, for example, polyvinyl alcohol (PVA), polystyrene (PS), polvacrylate, polyvinyl pyrrolidone (PVP), carboxymethylcellulose (CMC), polymethylmethacrylate (PMMA), polysilsesquioxane (PSQ), polydimethylsiloxane (PDMS), and the like can be used. In the present embodiment, polyvinyl pyrrolidone (PVP) is used as the first insulating polymer 37 of the electron transport layer 33.

Note that the mixing ratio of the first insulating polymer 37 in the electron transport layer 33, that is, the volume proportion of the first insulating polymer 37 in the electron transport layer 33 is preferably equal to or greater than 30% and equal to or less than 80%, and more preferably equal to or greater than 10% and equal to or less than 60%.

Further, the volume proportion of the n-type semiconductor particles 36 in the electron transport layer 33 of the electroluminescent element XR including the light-emitting layer 24R, which includes quantum dots having a red light emission wavelength and emits light in a red wavelength region, is preferably equal to or greater than 5% and equal to or less than 65%, As illustrated in FIG. 2, a lower end of a conduction band of the light-emitting layer 24R that includes quantum dots having a red light emission wavelength and emits light in a red wavelength region is located relatively close to a lower end of a conduction band of the electron transport layer (ETL) 33, and thus the injection of electrons 39 from the electron transport layer (ETL) 33 to the light-emitting layer 24R occurs relatively easily. Thus, in the electroluminescent element XR provided with the light-emitting layer 24R, it is preferable that the n-type semiconductor particles 36 that contribute to an improvement in the electron transport property be included in the electron transport layer 33 at a volume proportion of equal to or greater than 5% and equal to or less than 65%. Note that the reason for this will be described below.

Note that the volume proportion of the n-type semiconductor particles 36 in the electron transport layer 33 or the volume proportion of the first insulating polymer 37 in the electron transport layer 33 can also be determined from the particle size of the n-type semiconductor particles 36 and the area ratio of the first insulating polymer 37 filling a void portion, for example, by checking an electron microscopy image of the cross section of the electroluminescent element XR.

The thickness (film thickness) of the electron transport layer 33 is preferably larger than the particle size of the n-type semiconductor particles 36, and the n-type semiconductor particles 36 are preferably formed such that there are two or more layers thereof in the thickness (film thickness) direction of the electron transport layer 33. Thereby, it is possible to reduce the surface roughness of the electron transport layer 33 and increase the uniformity of electron injection in a film surface direction of the electron transport layer 33. The thickness (film thickness) of the electron transport layer 33 is preferably equal to or greater than 10 nm and equal to or less than 200 nm.

Note that, in the present embodiment, a case where inorganic nanoparticles consisting of, for example, nickel oxide (for example, MO) which are hole-transporting inorganic nanoparticles are used as the p-type semiconductor particles 34 is described as an example. However, the disclosure is not limited thereto, and any one of, for example, inorganic nanoparticles consisting of copper oxide (for example, CuO), inorganic nanoparticles consisting of chromium oxide (for example, $Cr_2O_3$), inorganic nanoparticles consisting of lithium nickelate (for example, $LiNiO_2$), inorganic nanoparticles consisting of nickel acid lanthanum (for example, $LaNiO_3$), and inorganic nanoparticles consisting of gallium nitride (for example, (GaN) may be used as long as the inorganic nanoparticles are hole-transporting inorganic nanoparticles. Further, as the p-type semiconductor particles 34, for example, inorganic nanoparticles consisting of a mixture containing two or more types among nickel oxide, copper oxide, chromium oxide, lithium nickelate, lanthanum nickelate, and gallium nitride may be used. Further, as the p-type semiconductor particles 34, a plurality of types among, for example, inorganic nanoparticles consisting of nickel oxide, inorganic nanoparticles consisting of copper oxide, inorganic nanoparticles consisting of chromium oxide, inorganic nanoparticles consisting of lithium nickelate, inorganic nanoparticles consisting of lanthanum nickelate, and inorganic nanoparticles consisting of gallium nitride may be used.

Note that, although the particle size of the p-type semiconductor particles 34 in the hole transport layer 30 is not particularly limited, the particle size is preferably equal to or greater than 1 nm from the viewpoint of suppressing aggregation of particles, and the particle size is preferably equal to or less than 30 nm from the viewpoint of reducing the surface roughness of the hole transport layer 30 and the surface roughness of the electroluminescent element XR. Thus, in the present embodiment, inorganic nanoparticies consisting of nickel oxide (for example, NiO) having a particle size of 12 nm are used as the p-type semiconductor particles 34.

Further, the particle size of the p-type semiconductor particles 34 is preferably equal to or greater than 1 nm and equal to or less than 10 nm from the viewpoint of expressing a quantum size effect, improving hole injection efficiency, and obtaining an effect of blocking electrons which are counter carriers.

In addition, similarly to the case of the first insulating polymer 37 of the electron transport layer 33, as the second insulating polymer 35 of the hole transport layer 30, for example, polyvinyl alcohol (PVA), polystyrene (PS), polyacrylate, polyvinyl pyrrolidone (PVP), carboxymethylcellulose (CMC), polymethylmethacrylate (PMMA), polysilsesquioxane (PSQ), polydimethylsiloxane (PDMS), and the like can be used. In the present embodiment, similarly to the case of the first insulating polymer 37 of the electron transport layer 33, polyvinyl pyrrolidone (PVP) is used as the second insulating polymer 35 of the hole transport layer 30, However, the disclosure is not limited thereto, and the second insulating polymer 35 of the hole transport layer 30 may be an insulating polymer of a type different from the first insulating polymer 37 of the electron transport layer 33.

Note that, in the electroluminescent element XR provided with the light-emitting layer 24R, the volume proportion of the p-type semiconductor particles 34 in the hole transport layer 30 is greater than the volume proportion of the n-type semiconductor particles 36 in the electron transport layer 33, and the volume proportion of the n-type semiconductor particles 36 in the electron transport layer 33 is preferably equal to or greater than 5% and equal to or less than 65%. Thus, the volume proportion of the p-type semiconductor particles 34 in the hole transport layer 30 is preferably equal to or greater than 80% and equal to or less than 99.99%. That is, the difference between the volume proportion of the p-type semiconductor particles 34 in the hole transport layer 30 and the volume proportion of the n-type semiconductor particles 36 in the electron transport layer 33 is preferably equal to or greater than 20%.

Note that the volume proportion of the p-type semiconductor particles 34 in the hole transport layer 30 or the volume proportion of the second insulating polymer 35 in the hole transport layer 30 can also be determined from the particle size of the p-type semiconductor particles 34 and the area ratio of the second insulating polymer 35 filling a void portion, for example, by checking an electron microscopy image of the cross section of the electroluminescent element XR, The thickness (film thickness) of the hole transport layer 30 is preferably larger than the particle size of the p-type semiconductor particles 34, and the p-type semiconductor particles 34 are preferably formed such that there are two or more layers thereof in the thickness (film thickness) direction of the hole transport layer 30. Thereby, it is possible to reduce the surface roughness of the hole transport layer 30 and increase the uniformity of hole injection in the film surface direction of the hole transport layer 30. The thickness (film thickness) of the hole transport layer 30 is preferably equal to or greater than 10 nm and equal to or less than 200 nm.

As illustrated in FIG. 2, in the electroluminescent element XR, an injection barrier of the electrons 39, which is a difference between the lower end of the conduction band of the electron transport layer (ETL) 33 and the lower end of the conduction band of the light-emitting layer 24R, is smaller than an injection barrier of holes 38, which is a difference between an upper end of a valence band of the hole transport layer (HTL) 30 and an upper end of a valence band of the light-emitting layer 24R, and thus the light-emitting layer 24R is originally in a state of having an excessive number of the electrons 39. Consequently, in the electroluminescent element XR, the state of having an excessive number of the electrons 39 in the light-emitting layer 24R is improved by setting the volume proportion of the p-type semiconductor particles 34 in the hole transport layer 30 to be higher than the volume proportion of the n-type semiconductor particles 36 in the electron transport layer 33, reducing the amount of electrons 39 injected into the light-emitting layer 24R, and increasing the amount of the holes 38 injected into the light-emitting layer 24R. In this manner, it is possible to improve the light emission characteristics of the electroluminescent element XR by improving the balance between the number of holes 38 and the number of electrons 39 in the light-emitting layer 24R, that is, by improving the carrier balance.

In addition, the difference between the volume proportion of the p-type semiconductor particles 34 in the hole transport layer 30 and the volume proportion of the n-type semiconductor particles 36 in the electron transport layer 33 is preferably equal to or greater than 20% for the following reason. This is because, in a case where a difference between the volume proportion of the p-type semiconductor particles 34 in the hole transport layer 30 and the volume proportion of the n-type semiconductor particles 36 in the electron transport layer 33 is less than 20%, a carrier balance is improved, but the quantum dots of the light-emitting layer 24R are still in a state of having an excessive number of the electrons 39, and there is also a concern that the holes 38 and the electrons 39 that have not been injected into the quantum dots of the light-emitting layer 24R may be recombined and emit light outside the quantum dots of the light-emitting layer 24R, which may result in a reduction in emission color purity when the holes 38 and the electrons 39 are recombined and emit light outside the quantum dots of the light-emitting layer 24R in this manner.

Note that, in a case where the difference between the volume proportion of the p-type semiconductor particles 34 in the hole transport layer 30 and the volume proportion of the n-type semiconductor particles 36 in the electron transport layer 33 is less than 20% even in the case of an electroluminescent element including a light-emitting layer that does not include quantum dots, the carrier balance is improved, but the light-emitting layer that does not include quantum dots is still in a state of having an excessive number of the electrons 39, and thus the difference between the volume proportion of the p-type semiconductor particles 34 in the hole transport layer 30 and the volume proportion of the n-type semiconductor particles 36 in the electron transport layer 33 is preferably equal to or greater than 70%.

Further, in the hole transport layer 30 provided in the electroluminescent element XR, the p-type semiconductor particles 34 and the second insulating polymer 35 are mixed, and thus an area where the second insulating polymer 35 and first quantum dots of the light-emitting layer 24R are in contact with each other is increased, as compared with a case where the p-type semiconductor particles 34 are used independently as a hole transport layer at an interface with the light-emitting layer 24R including the first quantum dots. Thus, the hole transport layer 30 can suppress deactivation of excitons due to the p-type semiconductor particles 34 directly contacting the first quantum dots of the light-emitting layer 24R, and also functions as a blocking layer of electrons which are counter carriers.

Note that even in the case of an electroluminescent element including a light-emitting layer that does not include quantum dots, the hole transport layer 30 is configured such that the p-type semiconductor particles 34 and the second insulating polymer 35 are mixed, and thus an area where the second insulating polymer 35 and the light-emitting layer that does not include quantum dots are in contact with each other is increased, as compared with a case where the p-type semiconductor particles 34 are used independently as a hole transport layer at an interface with the light-emitting layer that does not include quantum dots. Thus, the hole transport layer 30 can suppress deactivation of excitons due to the p-type semiconductor particles 34 directly contacting the light-emitting layer that does not include quantum dots, and also functions as a blocking layer of electrons which are counter carriers.

Similarly, in the electron transport layer 33 provided in the electroluminescent element XR, the n-type semiconductor particles 36 and the first insulating polymer 37 are mixed, and thus an area where the first insulating polymer 37 and the first quantum dots of the light-emitting layer 24R are in contact with each other is increased, as compared with a case where the n-type semiconductor particles 36 are used independently as an electron transport layer at an interface with the light-emitting layer 24R including quantum dots. Thus, the electron transport layer 33 can suppress deactivation of excitons due to the n-type semiconductor particles 36 directly contacting the first quantum dots of the light-emitting layer 24R, and also functions as a blocking layer of holes which are counter carriers.

Note that even in the case of an electroluminescent element including a light-emitting layer that does not include quantum dots, the electron transport layer 33 is configured such that the n-type semiconductor particles 36 and the first insulating polymer 37 are mixed, and thus an area where the first insulating polymer 37 and the light-emitting layer that does not include quantum dots are in contact with each other is increased, as compared with a case where the n-type semiconductor particles 36 are used independently as an electron transport layer at an interface with the light-emitting layer that does not include quantum dots. Thus, the electron transport layer 33 can suppress deactivation of excitons due to the n-type semiconductor particles 36 directly contacting the light-emitting layer that does not include quantum dots, and also functions as a blocking layer of holes which are counter carriers.

In the manufacture of the electroluminescent element XR described above, for example, the hole transport layer 30 may be applied and formed by mixing the p-type semiconductor particles 34 and the second insulating polymer 35 and dissolving the mixture in a solvent at a desired ratio, the light-emitting layer 24R including the first quantum dots may be applied and formed by mixing quantum dots and a polymer material (conductive material oriand non-conductive material) and dissolving the mixture in a solvent at a desired ratio, and the electron transport layer 33 may be applied and formed by mixing the n-type semiconductor particles 36 and the first insulating polymer 37 and dissolving the mixture in a solvent at a desired ratio. As the solvent, it is preferable to apply a solvent capable of dissolving the first insulating polymer 37, the polymer material (conductive material and/or non-conductive material), or the second insulating polymer 35. For example, water, methanol, ethanol, acetone, ethylene glycol, DMSO, trichloroethylene, and the like can be applied as polar solvents, and benzene, toluene, xylene, n-hexane, cyclohexane, and the like can be applied as non-polar solvents.

In addition, an application formation method of each of the hole transport layer 30, the light-emitting layer 24R including the first quantum dots, and the electron transport layer 33 is not particularly limited, but an application formation method such as spin coating, dip coating, spraying, ink jet, slit coating, or screen printing can be used.

As described above, in the manufacture of the electroluminescent element XR, a series of processes for forming the hole transport layer 30, the light-emitting layer 24R including the first quantum dots, and the electron transport layer 33 can be performed as an application process, and the electroluminescent element XR can be manufactured using a relatively simple manufacturing device and a manufacturing process.

In addition, the hole transport layer 30, the light-emitting layer 24R including the first quantum dots, and the electron transport layer 33 which are provided in the electroluminescent element XR manufactured in this manner are all mixed with a polymer material, and thus the surface roughness of each layer is reduced, as compared with a case where the electroluminescent element XR is formed by a single body of the p-type semiconductor particles 34, the quantum dots, or the n-type semiconductor particles 36. Further, the flatness of the light-emitting layer 24R, including the first quantum dots, which is formed on the hole transport layer 30 is improved. As a result, an effect of improving the surface uniformity of carrier injection and improving light emission characteristics is obtained.

In the present embodiment, a case where the anode 22 and the hole transport layer (HTL) 30 are directly in contact with each other has been described as an example. However, the disclosure is not limited thereto, and a hole injection layer (HIL) for injecting holes may be further provided between the anode 22 and the hole transport layer (HTL) 30. The hole injection layer (HIL) may be an organic material, an inorganic material, nanoparticles, or a layer in which nanoparticles are dispersed in various types of polymer materials.

Figure 3:
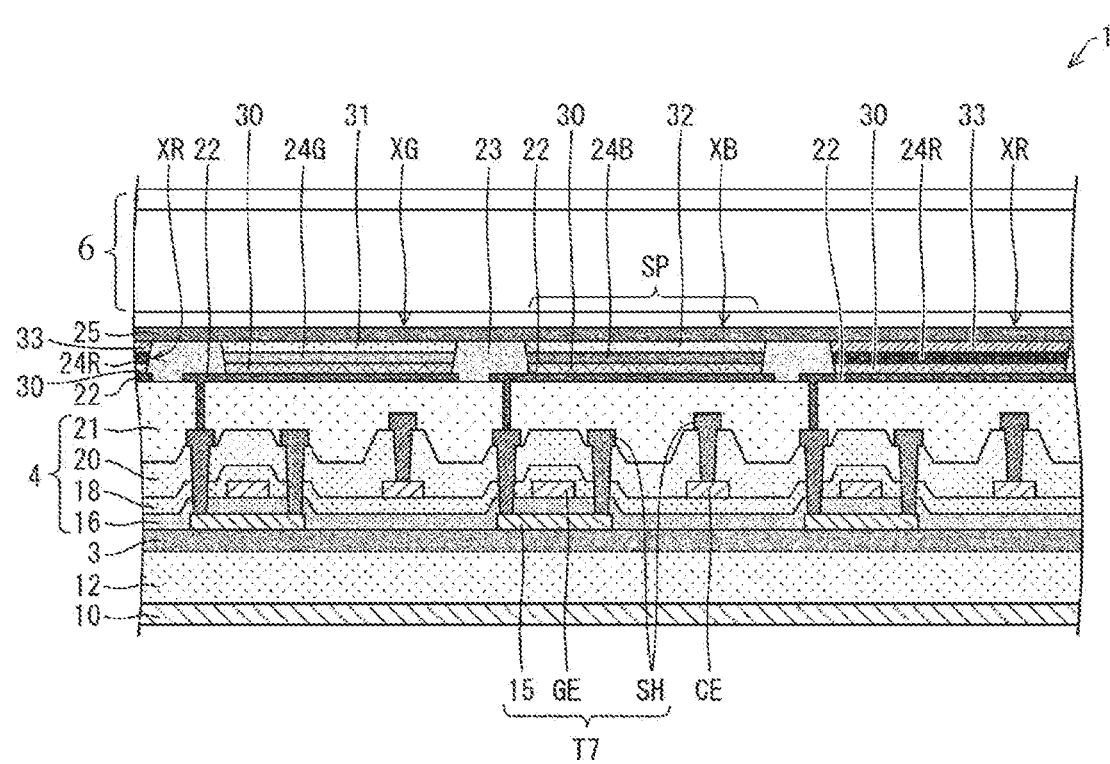
FIG. 3 is a diagram illustrating a schematic configuration of a display device including the electroluminescent element illustrated in FIG. 1.

FIG. 3 is a diagram illustrating a schematic configuration of a display device (electroluminescent device) 1 including the electroluminescent element XR illustrated in FIG. 1.

As illustrated in FIG. 3, a resin layer 12, a barrier layer 3, a TFT layer 4, electroluminescent elements XR, XG, and XB, and a sealing layer 6 are layered on one surface of a substrate 10 in the display device 1. Note that, in the present specification, a direction from the substrate 10 to the electroluminescent elements XR, XG, and XB in FIG. 3 is referred to as an "upward direction", and a direction from the electroluminescent elements XR, XG, and XB to the substrate 10 is referred to as a "downward direction". In other words, a "lower layer" means a layer that is formed in a process prior to that of a comparison layer, and an "upper layer" means a layer that is formed in a process after that of a comparison layer. That is, relatively speaking, a layer closer to the substrate 10 is a lower layer, and a layer farther from the substrate 10 is an upper layer.

Examples of the material of the substrate 10 include polyethylene terephthalate (PET), a glass substrate, and the like, but the material is not limited thereto. In the present embodiment, in order for the display device 1 to be a flexible display device, PET is used as the material of the substrate 10, but in a case where the display device 1 is a non-flexible display device, a glass substrate or the like may be used.

Examples of the material of the resin layer 12 include a polyimide resin, an epoxy resin, and a polyamide resin, but are not limited thereto. In the present embodiment, the display device 1 is made as a flexible display device by irradiating the resin layer 12 with laser light through a support substrate (not illustrated) to reduce the bonding strength between the support substrate (not illustrated) and the resin layer 12, peeling (laser lift off (LLO) process) the support substrate (not illustrated) from the resin layer 12, and adhering the substrate 10 formed of PET to the surface of the resin layer 12 where the support substrate (not illustrated) was peeled off. However, in a case where the display device 1 is formed as a non-flexible display device or in a case where the display device 1 is formed as a flexible display device by a method other than the LLO process, the resin layer 12 is not necessary.

The barrier layer 3 is a layer that prevents moisture or impurities from reaching the TFT layer 4 or the electroluminescent elements XR, XG, and XB when the display device 1 is being used, and can be constituted by a silicon oxide film, a silicon nitride film, or a silicon oxynitride film, or by a layered film thereof, for example, formed by CVD The TFT layer 4 includes a semiconductor film 15, an inorganic insulating film 16 (gate insulating film) above the semiconductor film 15, a gate electrode GE above the inorganic insulating film 16, an inorganic insulating film 18 above the gate electrode GE, a capacitance wiring line CE above the inorganic insulating film IS, an inorganic insulating film 20 above the capacitance wiring line CE, a source-drain wiring line SH including a source-drain electrode above the inorganic insulating film 20, and a flattening film 21 above the source-drain wiring line SH.

A thin film transistor element Tr (TFT element) as an active element is configured to include the semiconductor film 15, the inorganic insulating film 16 (gate insulating film), the gate electrode GE, the inorganic insulating film 18, the inorganic insulating film 20, and the source-drain wiring line SH.

The semiconductor film 15 is formed of, for example, low-temperature polysilicon (LTPS) or an oxide semiconductor. Note that FIG. 1 illustrates the TFT that has a top gate structure including the semiconductor film 15 as a channel, but the TFT may have a bottom gate structure.

The gate electrode GE, the capacitance electrode CE, the source-drain wiring line SH, and the like are formed of, for example, a single film or a layered film of metal containing at least one of aluminum (Al), tungsten (W), molybdenum (Mo), tantalum (Ta), chromium (Cr), titanium (Ti), or copper (Cu).

The inorganic insulating films 16, 18, and 20 may be constituted by, for example, a silicon oxide (SiOx) film, a silicon nitride (SiNx) film, a silicon oxynitride film, or a layered film thereof, formed by CVD.

The flattening film (interlayer insulating film) 21 may be formed of, for example, a coatable photosensitive organic material such as a polyimide resin or an acrylic resin.

FIGS. 1 and 2 illustrate only a schematic configuration of the electroluminescent element XR including the light-emitting layer 24R that emits light in a red wavelength region among the electroluminescent elements XR, XG, and XB included in the display device 1 as an example. However, as illustrated in FIG. 3, the display device 1 also includes the electroluminescent element XG (second electroluminescent element) and the electroluminescent element (third electroluminescent element) XB in addition to the electroluminescent element (first electroluminescent element) XR. The electroluminescent element XR has already been described above, and thus the electroluminescent element XG and the electroluminescent element XB will be specifically described here.

The electroluminescent element XG illustrated in FIG. 3 includes an anode (anode electrode) 22, a cathode (cathode electrode) 25, and a light-emitting layer (second light-emitting layer) 24G including second quantum dots having a green light emission wavelength between the anode (second anode) 22 and the cathode (second cathode)) 25. Further, the electroluminescent element XG includes an electron transport layer 31 including n-type semiconductor particles (second n-type semiconductor particles) 36 and a first insulating polymer (third insulating polymer) 37, and a hole transport layer (second hole transport layer) 30 including p-type semiconductor particles (second p-type semiconductor particles) 34. The electron transport layer 31 is provided between the cathode 25 and the light-emitting layer 24G, and the hole transport layer 30 is provided between the anode 22 and the light-emitting layer 24G. Note that, in the electroluminescent element XG, a volume proportion of the n-type semiconductor particles 36 in the electron transport layer (second electron transport layer) 31 is smaller than a volume proportion of the p-type semiconductor particles 34 in the hole transport layer 30.

In addition, the electroluminescent element XB illustrated in FIG. 3 includes an anode (anode electrode) 22, a cathode (cathode electrode) 25, and a light-emitting layer (third light-emitting layer) 24B including third quantum dots having a blue light emission wavelength between the anode (third anode) 22 and the cathode (third cathode) 25. Further, the electroluminescent element XB includes an electron transport layer 32 including n-type semiconductor particles (third n-type semiconductor particles) 36 and a first insulating polymer (fourth insulating polymer) 37, and a hole transport layer (third hole transport layer) 30 including p-type semiconductor particles (third p-type semiconductor particles) 34. The electron transport layer 32 is provided between the cathode 25 and the light-emitting layer 24B, and the hole transport layer 30 is provided between the anode 22 and the light-emitting layer 24G. Note that, in the electroluminescent element XB, a volume proportion of the n-type semiconductor particles 36 in the electron transport layer (third electron transport layer) 32 is smaller than a volume proportion of the p-type semiconductor particles 34 in the hole transport layer 30.

In the present embodiment, a case where the hole transport layer including the p-type semiconductor particles 34 and the second insulating polymer 35 is used as the hole transport layer 30 including the p-type semiconductor particles 34 is described as an example. However, the disclosure is not limited thereto, and a hole transport layer including only the p-type semiconductor particles 34 may be used as the hole transport layer 30 including the p-type semiconductor particles 34.

In the present embodiment, similarly to the n-type semiconductor particles 36 included in the electron transport layer 33 provided in the electroluminescent element XR described above, a case where inorganic nanoparticles consisting of, for example, zinc oxide (for example, ZnO), which are electron-transporting inorganic nanoparticles, are used as the n-type semiconductor particles 36 included in the electron transport layer 31 provided in the electroluminescent element XG and the n-type semiconductor particles 36 included in the electron transport layer 32 provided in the electroluminescent element XB is described as an example. However, the disclosure is not limited thereto, and other materials that have already been described in the case of the electron transport layer 33 provided in the electroluminescent element XR may be used.

Further, in the present embodiment, a case where the n-type semiconductor particles 36 included in the electron transport layer 31, the electron transport layer 32, and the electron transport layer 33 consist of the same material is described as an example. However, the disclosure is not limited thereto, and for example, different materials may be used for the n-type semiconductor particles 36 included in the electron transport layer 31, the electron transport layer 32, and the electron transport layer 33. In addition, for example, two layers may be formed using the same material, and the remaining one layer may be formed using a material different from those of the two layers.

In the present embodiment, similarly to the first insulating polymer 37 included in the electron transport layer 33 provided in the electroluminescent element XR described above, a case where polyvinyl pyrrolidone (PVP) is used as the first insulating polymer 37 included in the electron transport layer 31 provided in the electroluminescent element XG and the first insulating polymer 37 included in the electron transport layer 32 provided in the electroluminescent element XB is described as an example. However, the disclosure is not limited thereto, and other materials that have already been described in the case of the electron transport layer 33 provided in the electroluminescent element XR may be used.

Further, in the present embodiment, a case where the first insulating polymers 37 included in the electron transport layer 31, the electron transport layer 32, and the electron transport layer 33 are formed of the same material is described as an example. However, the disclosure is not limited thereto, and for example, different materials may be used for the first insulating polymers 37 included in the electron transport layer 31, the electron transport layer 32, and the electron transport layer 33. In addition, for example, two layers may be formed using the same material, and the remaining one layer may be formed using a material different from those of the two layers.

In the present embodiment, similarly to the p-type semiconductor particles 34 included in the hole transport layer 30 provided in the electroluminescent element XR described above, a case where inorganic nanoparticles consisting of, for example, nickel oxide (for example, NiO), which are hole-transporting inorganic nanoparticles, are used as the p-type semiconductor particles 34 included in the hole transport layer 30 provided in the electroluminescent element XG and the p-type semiconductor particles 34 included in the hole transport layer 30 provided in the electroluminescent element XB is described as an example. However, the disclosure is not limited thereto, and other materials that have already been described in the case of the hole transport layer 30 provided in the electroluminescent element XR may be used.

Further, in the present embodiment, a case where the p-type semiconductor particles 34 included in the hole transport layer 30 provided in the electroluminescent element XR, the hole transport layer 30 provided in the electroluminescent element XG, and the hole transport layer 30 provided in the electroluminescent element XB consist of the same material is described as an example. However, the disclosure is not limited thereto, and for example, different materials may be used for the p-type semiconductor particles 34 included in the hole transport layer 30 provided in the electroluminescent element XR, the hole transport layer 30 provided in the electroluminescent element XG, and the hole transport layer 30 provided in the electroluminescent element XB. In addition, for example, two layers may be formed using the same material, and the remaining one layer may be formed using a material different from those of the two layers, In the present embodiment, similarly to the second insulating polymer 35 included in the hole transport layer 30 provided in the electroluminescent element XR, a case where polyvinyl pyrrolidone (PVP) is used as the second insulating polymer 35 included in the hole transport layer 30 provided in the electroluminescent element XG and the second insulating polymer 35 included in the hole transport layer 30 provided in the electroluminescent element XB is described as an example. However, the disclosure is not limited thereto, and other materials that have already been described in the case of the hole transport layer 30 provided in the electroluminescent element XR may be used.

Further, in the present embodiment, a case where the second insulating polymers 35 included in the hole transport layer 30 provided in the electroluminescent element XR, the hole transport layer 30 provided in the electroluminescent element XG, and the hole transport layer 30 provided in the electroluminescent element XB consist of the same material is described as an example. However, the disclosure is not limited thereto, and for example, different materials may be used for the second insulating polymer 35 included in the hole transport layer 30 provided in the electroluminescent element XR, the hole transport layer 30 provided in the electroluminescent element XG, and the hole transport layer 30 provided in the electroluminescent element XB. In addition, for example, two layers may be formed using the same material, and the remaining one layer may be formed using a material different from those of the two layers.

Note that, in the display device 1 illustrated in FIG. 3, each of the hole transport layer 30 provided in the electroluminescent element XR, the hole transport layer 30 provided in the electroluminescent element XG, and the hole transport layer 30 provided in the electroluminescent element XB is formed to have an island shape. However, the disclosure is not limited thereto, and, as in a second embodiment to be described later, the hole transport layer 30 provided in the electroluminescent element XR, the hole transport layer 30 provided in the electroluminescent element XG, and the hole transport layer 30 provided in the electroluminescent element XB may be formed as one common layer.

Note that a lower end of a conduction band of each of the light-emitting layer 24B including the third quantum dots having a blue light emission wavelength and the light-emitting layer 24G including the second quantum dots having a green light emission wavelength is positioned to be higher than the lower end of the conduction band of the light-emitting, layer 24R including the first quantum dots having a red light emission wavelength illustrated in FIG. 2, that is, above the lower end of the conduction band of the light-emitting layer 24R in FIG. 2. In particular, a lower end of a conduction band of the light-emitting layer 24B including quantum dots having a blue light emission wavelength is positioned to be higher than the lower end of the conduction band of the light-emitting layer 24G including the second quantum dots having a green light emission wavelength and is positioned above the lower end of the conduction band of the light-emitting layer 24G in FIG. 2.

Thus, an injection barrier of the electrons 39, which is a difference between the lower end of the conduction band of the electron transport layer (ETL) 32 and the lower end of the conduction band of the light-emitting layer 24B in the electroluminescent element XB, and an injection barrier of the electrons 39, which is a difference between the lower end of the conduction band of the electron transport layer (ETL) 31 and the lower end of the conduction band of the light-emitting layer 24G in the electroluminescent element XG, are larger than an injection barrier of the electrons 39, which is a difference between the lower end of the conduction band of the electron transport layer (EFL) 33 and the lower end of the conduction band of the light-emitting layer 24R in the electroluminescent element XR illustrated in FIG. 2. In addition, an injection barrier of the electrons 39, which is a difference between the lower end of the conduction band of the electron transport layer (ETL) 32 and the lower end of the conduction band of the light-emitting layer 24B, in the electroluminescent element XB is larger than an injection barrier of the electrons 39, which is a difference between the lower end of the conduction band of the electron transport layer (ETL) 31 and the lower end of the conduction band of the light-emitting layer 24G in the electroluminescent element XG.

Note that the characteristics described above are also applied as they are to a light-emitting layer having a red light emission wavelength that does not include quantum dots, a light-emitting layer having a green light emission wavelength that does not include quantum dots, and a light-emitting layer having a blue light emission wavelength that does not include quantum dots.

For this reason, in the display device 1, each of a volume proportion of the n-type semiconductor particles 36 in the electron transport layer (ETL) 31 of the electroluminescent element XG and a volume proportion of the n-type semiconductor particles 36 in the electron transport layer (ETL) 32 of the electroluminescent element XB is set to be higher than a volume proportion of the n-type semiconductor particles 36 in the electron transport layer (ETL) 33 of the electroluminescent element XR. Further, the volume proportion of n-type semiconductor particles 36 in the electron transport layer (ETL) 32 of the electroluminescent element XB is set to be higher than the volume proportion of the n-type semiconductor particles 36 in the electron transport layer (ETL) 31 of electroluminescent element XG.

Specifically, within a range satisfying the relationship of the volume proportion of the n-type semiconductor particles 36 in the electron transport layer (ETL) 32 of the electroluminescent element XB>the volume proportion of the n-type semiconductor particles 36 in the electron transport layer (ETL) 31 of the electroluminescent element XG>the volume proportion of the n-type semiconductor particles 36 in the electron transport layer (ETL) 33 of the electroluminescent element XR, the volume proportion of the n-type semiconductor particles 36 in the electron transport layer (ETL) 33 of the electroluminescent element XR is preferably equal to or greater than 5% and equal to or less than 65%, the volume proportion of the n-type semiconductor particles 36 in the electron transport layer (ETL) 31 of the electroluminescent element XG is preferably equal to or greater than 30% and equal to or less than 90%, and the volume proportion of the n-type semiconductor particles 36 in the electron transport layer (ETL) 32 of the electroluminescent element XB is preferably equal to or greater than 40% and equal to or less than 95%.

Further, each of the volume proportion of the n-type semiconductor particles 36 in the electron transport layer (ETL) 33 of the electroluminescent element XR, the volume proportion of the n-type semiconductor particles 36 in the electron transport layer (ETL) 31 of the electroluminescent element XG, and the volume proportion of the n-type semiconductor particles 36 in the electron transport layer (ETL) 32 of the electroluminescent element XB is determined within a range in which each of the volume proportions is smaller than the volume proportion of the p-type semiconductor particles 34 in the hole transport layer 30 (equal to or greater than 80% and equal to or less than 99.99% in the present embodiment).

Note that, in each of the electroluminescent element XR, the electroluminescent element XG, and the electroluminescent element XB, the difference between the volume proportion of the p-type semiconductor particles 34 in the hole transport layer 30 (equal to or greater than 80% and equal to or less than 99.99% in the present embodiment) and each of the volume proportion of the n-type semiconductor particles 36 in the electron transport layer (ETL) 31, the volume proportion of the n-type semiconductor particles 36 in the electron transport layer (ETL) 32, and the volume proportion of the n-type semiconductor particles 36 in the electron transport layer (ETL) 33 is preferably equal to or greater than 20%.

Figure 5:
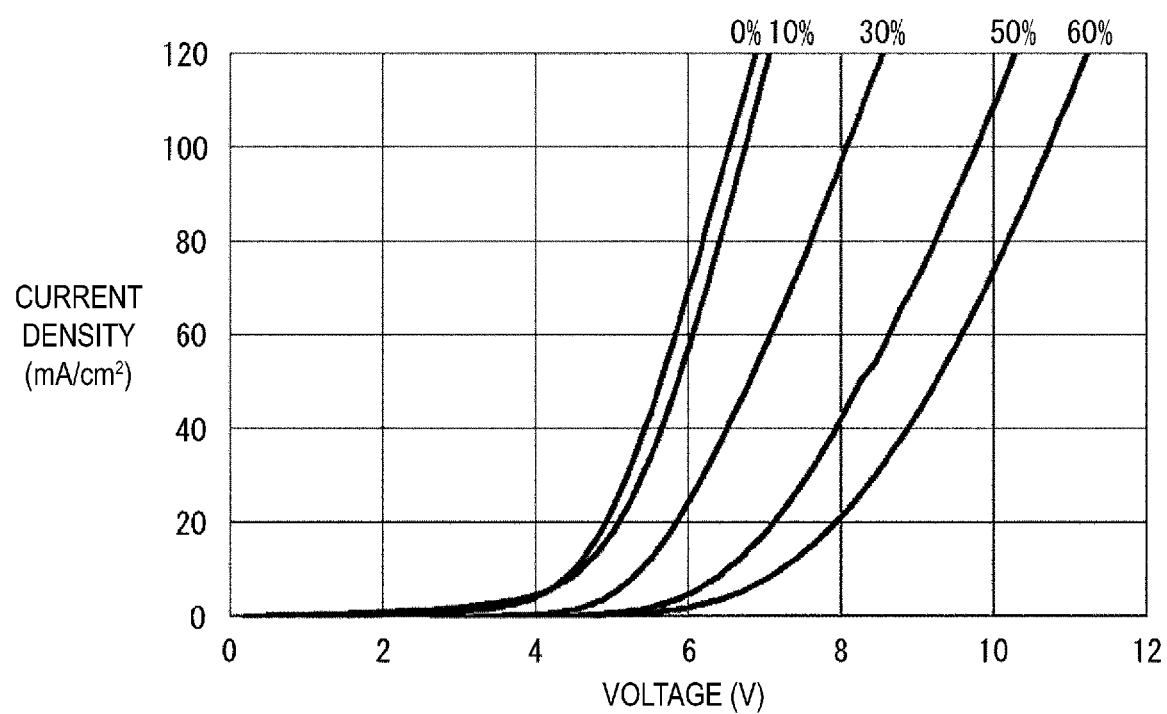
FIG. 5 is a diagram illustrating a relationship between voltage and current density for each volume proportion of a first insulating polymer in an electron transport layer provided in the electroluminescent element illustrated in FIG. 1.

FIG. 5 is a diagram illustrating the relationship between voltage and current density for each volume proportion of the first insulating polymer 37 in the electron transport layer 33 provided in the electroluminescent element XR illustrated in FIG. 1.

Results illustrated in FIG. 5 are results of current densities measured while changing an applied voltage for each sample manufactured as follows.

Each of a 0% sample electroluminescent element, a 10% sample electroluminescent element, a 30% sample electroluminescent element, a 50% sample electroluminescent element, and a 60% sample electroluminescent element is a sample electroluminescent element in which PEDOT:PSS/PVK, which is a hole transport layer, the light-emitting layer 24R including the first quantum dots, an electron transport layer including inorganic nanoparticles having an average particle size of 12 nm consisting of zinc oxide (for example, ZnO) as the n-type semiconductor particles 36 and polyvinyl pyrrolidone (PVP) as the first insulating polymer 37 at a predetermined ratio, and Al as the cathode 25 are layered on Indium Tin Oxide (ITO) as the anode 22 in this order. The 0% sample electroluminescent element is a sample electroluminescent element in which the volume proportion of the first insulating polymer 37 in the electron transport layer is 0% (the volume proportion of the n-type semiconductor particles 36 in the electron transport layer is 100%). The 10% sample electroluminescent element is a sample electroluminescent element in which the volume proportion of the first insulating polymer 37 in the electron transport layer is 10% (the volume proportion of the n-type semiconductor particles 36 in the electron transport layer is 90%). The 30% sample electroluminescent element is a sample electroluminescent element in which the volume proportion of the first insulating polymer 37 in the electron transport layer is 30% (the volume proportion of the n-type semiconductor particles 36 in the electron transport layer is 70%). The 50% sample electroluminescent element is a sample electroluminescent element in which the volume proportion of the first insulating polymer 37 in the electron transport layer is 50% (the volume proportion of the n-type semiconductor particles 36 in the electron transport layer is 50%). The 60% sample electroluminescent element is a sample electroluminescent element in which the volume proportion of the first insulating polymer 37 in the electron transport layer is 60% (the volume proportion of the n-type semiconductor particles 36 in the electron transport layer is 40%).

As illustrated in FIG. 5, even in any case of the 10% sample electroluminescent element, the 30% sample electroluminescent element, the 50% sample electroluminescent element, and the 60% sample electroluminescent element, it can be understood that the values of the current densities in the same voltage value are reduced, and the injection of electrons into the electroluminescent element is less likely to be performed, as compared with the 0% sample electroluminescent element in which the electron transport layer is formed of only zinc oxide as the n-type semiconductor particles 36.

Further, in each of the 10% sample electroluminescent element, the 30% sample electroluminescent element, the 50% sample electroluminescent element, and the 60% sample electroluminescent element, it can be understood that the degree of decrease in the value of the current density in the same voltage value increases as the volume proportion of the first insulating polymer 37 increases.

In this manner, the amount of electrons injected into the light-emitting layer including quantum dots can be appropriately controlled by appropriately changing the volume proportion of the n-type semiconductor particles 36 and the volume proportion of the first insulating polymer 37 in the electron transport layer.

Although not illustrated in the drawing, similarly to the case of the electron transport layer, the amount of holes injected into the light-emitting layer including quantum dots can be appropriately controlled by appropriately changing the volume proportion of the p-type semiconductor particles 34 and the volume proportion of the second insulating polymer 35 in the hole transport layer.

The light-emitting layer 24R, the light-emitting layer 24G, and the light-emitting layer 24B illustrated in FIG. 3 are light-emitting layers including a quantum dot (nanoparticle) phosphor. Hereinafter, "phosphor" is omitted for the sake of simplicity and is simply referred to as quantum dots (nanoparticles). As the specific material of the quantum dots (nanoparticles), for example, any of CdSe/CdS, CdSe/ZnS. InP/ZnS, and CIGS/ZnS can be used, and the particle size of the quantum dots (nanoparticles) may be approximately from 3 nm to 10 nm. Note that, in order to make the light-emitting layer 24R, the light-emitting layer 24G, and the light-emitting layer 24B have different center wavelengths of emitted light, the light-emitting layers may have different particle sizes of quantum dots (nanoparticles), or quantum dots (nanoparticles) of different types may be used.

As illustrated in FIG. 3, each of the electroluminescent element XR, the electroluminescent element XG, and the electroluminescent element XB is a subpixel SP of the display device 1, and for example, one electroluminescent element XR, one electroluminescent element XG, and one electroluminescent element XB may constitute one pixel of the display device 1.

As illustrated in FIG. 3, a bank 23 that covers the edge of the anode 22 can be formed of a coatable photosensitive organic material such as a polyimide resin or an acrylic resin.

In the present embodiment, a case where the anode 22, the hole transport layer (HTL) 30, the light-emitting layers 24R, 24G, and 24B, and the electron transport layers (ETL) 31, 32, and 33, except for the cathode 25 formed as a solid-like common layer, are formed in island shapes for each subpixel SP has been described as an example, but the disclosure is not limited thereto. For example, in a case where the cathode 25 is formed in an island shape, and the island-shaped cathode 25 is individually controlled and operated by a thin film transistor element or the like, the anode 22 may be formed as a solid-like common layer. Further, as will be described below, the hole transport layer (HTL) 30 may be formed as a solid-like common layer. Note that, in this case, the bank 23 need not be provided.

At least one of the anode 22 or the cathode 25 is formed of a light-transmissive material. Note that any one of the anode 22 and the cathode 25 may be formed of a light-reflective material. In a case where the display device 1 is formed as a top-emitting display device, the cathode 25 being an upper layer is formed of a light-transmissive material, and the anode 22 being a lower layer is formed of a light-reflective material. In a case where the display device 1 is a bottom-emitting display device, the cathode 25 being an upper layer is formed of a light-reflective material, and the anode 22 being a lower layer is formed of a light-transmissive material. Note that, in a case where the order of layering from the anode 22 to the cathode 25 is reversed, the display device 1 can be formed as a top-emitting display device by the anode 22, being an upper layer, being formed of a light-transmissive material and the cathode 25, being a lower layer, being formed of a light-reflective material, or can be formed as a bottom-emitting display device by the anode 22, being an upper layer, being formed of a light-reflective material and the cathode 25, being a lower layer, being formed of a light-transmissive material.

As the light-transmissive material, for example, a transparent conductive film material can be used. Specifically, for example, Indium Tin Oxide (ITO), Indium Zinc Oxide (IZO), ZnO, aluminum-doped zinc oxide (AZO), boron-doped zinc oxide (BZO), or the like can be used. These materials have a high transmittance of visible light, and thus light emission efficiency is improved.

As the light-reflective material, a material having a high reflectivity of visible light is preferably used, and for example, a metal material can be used. Specifically, for example, Al, Cu, Au, Ag, or the like can be used. These materials have a high reflectivity of visible light, and thus light emission efficiency is improved.

In addition, either one of the anode 22 or the cathode 25 may be formed as a layered body including a light-transmissive material and a light-reflective material to form an electrode having light reflectivity.

Note that, in the present embodiment, the display device 1 is formed as a top-emitting type display device, and thus the cathode 25 being an upper layer is formed of a light-transmissive material, and the anode 22 being a lower layer is formed of a light-reflective material.

Note that the particle size of the p-type semiconductor particles 34 included in the hole transport layer 30 provided in the electroluminescent element XG and the particle size of the p-type semiconductor particles 34 included in the hole transport layer 30 provided in the electroluminescent element XB are preferably equal to or greater than 1 nm and equal to or less than 30 nm, respectively, similar to the particle size of the p-type semiconductor particles 34 included in the hole transport layer 30 provided in the electroluminescent element XR.

In addition, the thickness (film thickness) of each of the hole transport layer 30 provided in the electroluminescent element XG and the hole transport layer 30 provided in the electroluminescent element XB is preferably equal to or greater than 10 nm and equal to or less than 200 nm, similar to the hole transport layer 30 provided in the electroluminescent element XR.

In addition, the particle size of the n-type semiconductor particles 36 included in the electron transport layer 31 provided in the electroluminescent element XG and the particle size of the n-type semiconductor particles 36 included in the electron transport layer 32 provided in the electroluminescent element XB are preferably equal to or greater than 1 nm and equal to or less than 30 nm, similar to the particle size of the n-type semiconductor particles 36 included in the electron transport layer 33 provided in the electroluminescent element XR.

In addition, the thickness (film thickness) of each of the electron transport layer 31 provided in the electroluminescent element XG and the electron transport layer 32 provided in the electroluminescent element XB is preferably 10 nm or more and 200 nm or less, similar to the electron transport layer 33 provided in the electroluminescent element XR.

As described above, in the display device 1, it is possible to improve light emission characteristics of the electroluminescent elements XR, XG, and XB by improving a carrier balance in each of the electroluminescent element XR, the electroluminescent element XG, and the electroluminescent element XB. Thus, it is possible to realize the display device 1 that realizes efficient light emission with well-balanced holes and electrons in the light-emitting layer.

In the present embodiment, since the display device is described as an example of an electroluminescent device, a case where the display device 1 includes the electroluminescent element XR including the light-emitting layer 24R including the first quantum dots having a red light emission wavelength, the electroluminescent element XG including the light-emitting layer 24G including the second quantum dots having a green light emission wavelength, and the electroluminescent element XB including the light-emitting layer 24B including the third quantum dots having a blue light emission wavelength has been described as an example. However, for example, in a case where the electroluminescent device is an illumination device or the like, one or more electroluminescent elements of only one color type including a light-emitting layer including quantum dots having a light emission wavelength of any one color may be provided, or one or more first electroluminescent elements including a first light-emitting layer including first quantum dots and one or more second electroluminescent elements including a second light-emitting layer including second quantum dots having a shorter light emission wavelength than the first quantum dots may be provided.

Figure 4:
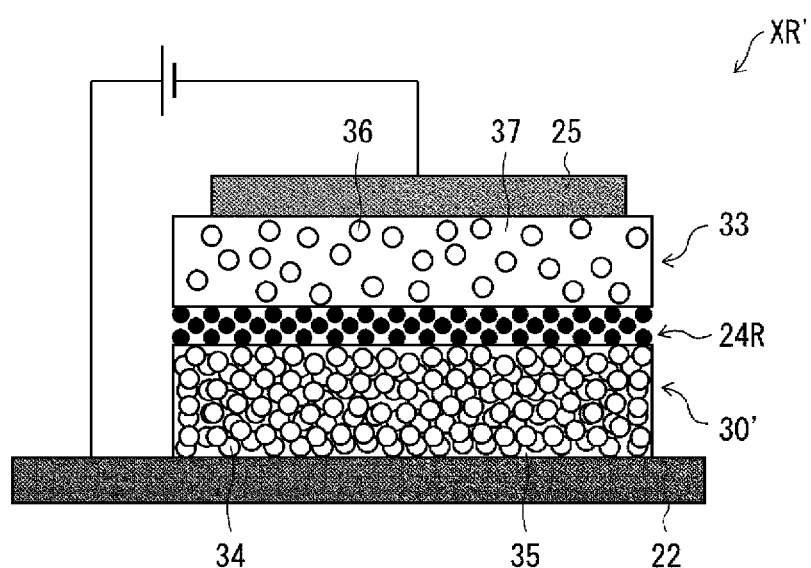
FIG. 4 is a diagram illustrating a modification example of the electroluminescent element illustrated in FIG. 1.

FIG. 4 is a diagram illustrating a schematic configuration of an electroluminescent element XR' which is a modification example of the electroluminescent element XR illustrated in FIG. 1.

In the electroluminescent element XR illustrated in FIG. 1, aggregation of inorganic nanoparticles is suppressed by using inorganic nanoparticles consisting of zinc oxide (for example, ZnO) having a particle size of 12 μm as the p-type semiconductor particles 34 included in the hole transport layer 30.

Similarly to the hole transport layer 30 provided in the electroluminescent element XR illustrated in FIG. 1, a hole transport layer 30' provided in the electroluminescent element XR' illustrated in FIG. 4 includes inorganic nanoparticles consisting of zinc oxide (for example, ZnO) as the p-type semiconductor particles 34 and polyvinyl pyrrolidone (PVP) as the second insulating polymer 35. A difference from the hole transport layer 30 provided in the electroluminescent element XR illustrated in FIG. 1 is that the particle size of the inorganic nanoparticles consisting of zinc oxide (for example, ZnO) is less than 1 nm. Specifically, the inorganic nanoparticles consisting of zinc oxide (for example, ZnO) as the p-type semiconductor particles 34 included in the hole transport layer 30' provided in the electroluminescent element XR' illustrated in FIG. 4 have an average particle size of 0.5 nm. Note that a volume proportion of the inorganic nanoparticles (average particle size of 0.5 nm) consisting of zinc oxide (for example, ZnO) as the p-type semiconductor particles 34 in the hole transport layer 30' is set to be a volume proportion of the inorganic nanoparticles (average particle size of 12 nm) consisting of zinc oxide (for example, ZnO) as the p-type semiconductor particles 34 in the hole transport layer 30 provided in the electroluminescent element XR illustrated in FIG. 1.

As illustrated in FIG. 4, aggregation of inorganic nanoparticles (average particle size of 0.5 nm) consisting of zinc oxide (for example, ZnO) occurs in the hole transport layer 30'. However, similarly to the electroluminescent element XR illustrated in FIG. 1, it is possible to improve a balance, that is, a carrier balance between the number of holes 38 and the number of electrons 39 in the light-emitting layer 24R and to improve light emission characteristics also in the electroluminescent element XR'.

Second Embodiment

Next, a second embodiment of the disclosure will be described with reference to FIG. 6. A display device 1' including electroluminescent elements XR", XG", and XB" of the present embodiment is different from that in the first embodiment in that a hole transport layer 30 provided in the electroluminescent element (first electroluminescent element) XR", a hole transport layer 30 provided in the electroluminescent element (second electroluminescent element) XG", and a hole transport layer 30 provided in the electroluminescent element (third electroluminescent element) XB" are formed as one common layer, and a cathode 25 provided in the electroluminescent element XR", a cathode 25 provided in the electroluminescent element XG", and a cathode 25 provided in the electroluminescent element XB" are formed in an island shape. For convenience of description, members having the same functions as those illustrated in the drawings in the first embodiment are denoted by the same reference numerals and signs, and descriptions thereof will be omitted.

Figure 6:
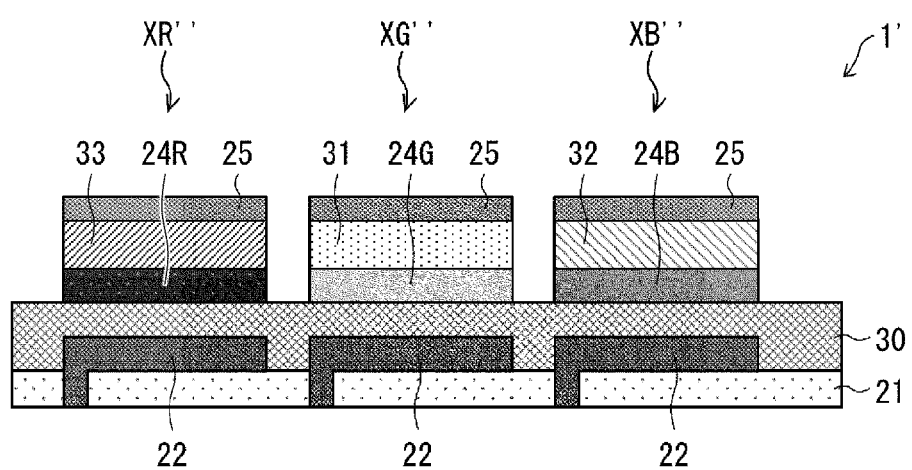
FIG. 6 is a diagram illustrating a schematic configuration of a display device including an electroluminescent element according to a second embodiment.

FIG. 6 is a diagram illustrating a schematic configuration of the display device 1' including the electroluminescent elements XR", XG", and XB" according to the second embodiment.

As illustrated in FIG. 6, in the display device 1' including the electroluminescent elements XR", XG", and XB", the hole transport layer 30 provided in the electroluminescent element XR", the hole transport layer 30 provided in the electroluminescent element XG", and the hole transport layer 30 provided in the electroluminescent element XB" are formed as one common layer. Thus, a patterning process for forming the hole transport layer 30 in an island shape, and the like can be omitted, and thus it is advantageous in terms of the manufacturing process. Further, by forming the hole transport layer 30 as a single common layer, the step of forming the bank 23 covering the edge of the anode 22 illustrated in FIG. 3 and the like can be omitted, and thus, it is advantageous in terms of the manufacturing process.

In addition, as illustrated in FIG. 6, in the display device 1' including the electroluminescent elements XR", XG", and XB", the cathode 25 provided in the electroluminescent element XR", the cathode 25 provided in the electroluminescent element XG", and the cathode 25 provided in the electroluminescent element XB" are formed in an island shape.

As described above, in the display device 1', it is possible to improve light emission characteristics of the electroluminescent elements XR", XG", and XB" by improving a carrier balance in each of the electroluminescent element XR", the electroluminescent element XG", and the electroluminescent element XB". Thus, it is possible to realize the display device that realizes efficient light emission with well-balanced holes and electrons in the light-emitting layer.

Third Embodiment

Next, a third embodiment of the disclosure will be described with reference to FIG. 7. An electroluminescent element XR''' of the present embodiment is different from that in the first embodiment in that the order of layering from an anode 22 to a cathode 25 is reversed. For convenience of description, members having the same functions as those illustrated in the drawings in the first embodiment are denoted by the same reference numerals and signs, and descriptions thereof will be omitted.

Figure 7:
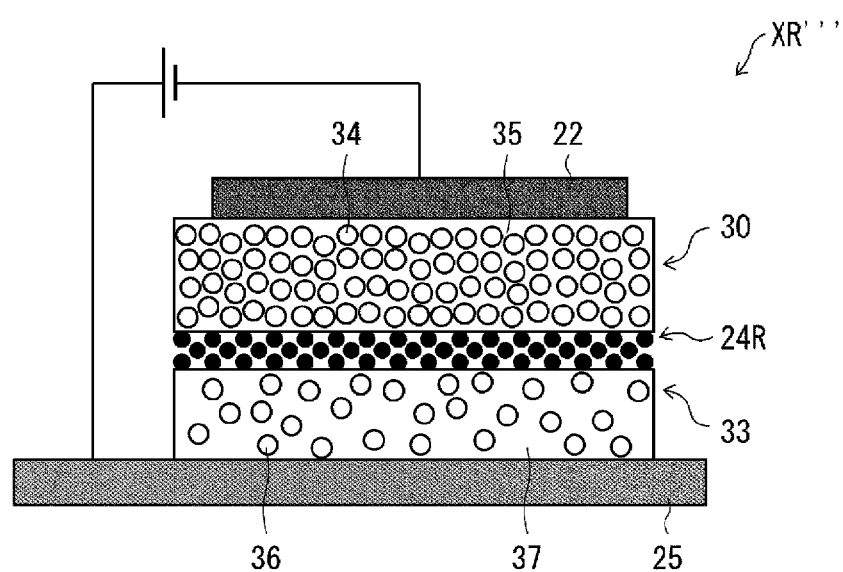
FIG. 7 is a diagram illustrating a schematic configuration of an electroluminescent element according to a third embodiment.

FIG. 7 is a diagram illustrating a schematic configuration of the electroluminescent element XR''' according the third embodiment.

As illustrated in FIG. 7, in the electroluminescent element XR''', the order of layering from the anode 22 to the cathode 25 is reversed with respect to that of the electroluminescent element XR illustrated in FIG. 1. That is, first, the cathode 25 is formed, an electron transport layer 33 is formed on the cathode 25, a light-emitting, layer 24R including first quantum dots is formed on the electron transport layer 33, a hole transport layer 30 is formed on the light-emitting layer 24R, and the anode 22 is formed on the hole transport layer 30. In such a case, even when the anode 22 is formed using a vacuum film forming method such as sputtering, because the hole transport layer 30 includes a second insulating polymer 35, it is possible to obtain the electroluminescent element XR''' having satisfactory light emission characteristics without imparting plasma damage to the light-emitting layer 24R including the first quantum dots.

Further, since the electron transport layer 33 includes a first insulating polymer 37, the flatness of the light-emitting layer 24R including the first quantum dots formed on the electron transport layer 33 is improved. As a result, an effect of improving the surface uniformity of carrier injection and improving light emission characteristics is obtained.

Fourth Embodiment

Next, a fourth embodiment of the disclosure will be described on the basis of FIG. 8. An electroluminescent element XR'''' of the present embodiment is different from that in the first embodiment in that an insulating layer 41 is provided between a light-emitting layer 24R and a hole transport layer 30, and an insulating layer 42 is provided between the light-emitting layer 24R and an electron transport layer 33. For convenience of description, members having the same functions as those illustrated in the drawings in the first embodiment are denoted by the same reference numerals and signs, and descriptions thereof will be omitted.

Figure 8:
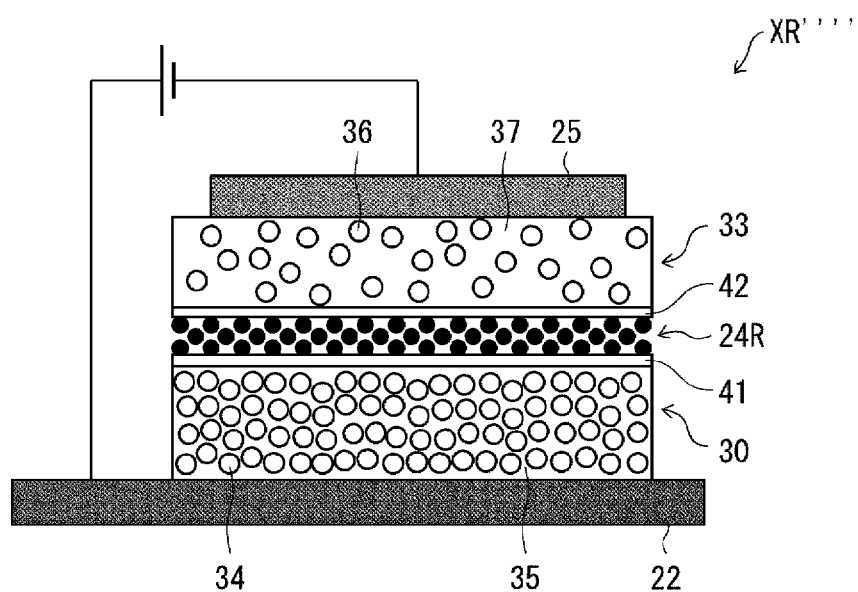
FIG. 8 is a diagram illustrating a schematic configuration of an electroluminescent element according to a fourth embodiment.

FIG. 8 is a diagram illustrating a schematic configuration of the electroluminescent element XR'''' according to the fourth embodiment.

As illustrated in FIG. 8, the electroluminescent element XR'''' includes the insulating layer 41 provided between the light-emitting layer 24R and the hole transport layer 30, and the insulating layer 42 provided between the light-emitting layer 24R and the electron transport layer 33.

The insulating layer 41 and the insulating layer 42 are both layers that do not include p-type semiconductor particles 34 and n-type semiconductor particles 36. The type of insulating layer 41 and the type of insulating layer 42 are not particularly limited as long as the insulating layer 41 and the insulating layer 42 do not include the p-type semiconductor particles 34 and the n-type semiconductor particles 36. However, the insulating layers may be, for example, polymers having conductivity, may be insulating layers formed of an inorganic oxide, or may be layers formed of an inorganic nitride.

Note that, by providing the insulating layer 41 and the insulating layer 42, the insulating layer 41 and the insulating layer 42 function as blocking layers that prevent the p-type semiconductor particles 34 and the n-type semiconductor particles 36 from directly touching the light-emitting layer 24R including the first quantum dots, prevent excitors generated by the light-emitting layer 24R including the first quantum dots from being trapped due to defect levels of the p-type semiconductor particles 34 and the n-type semiconductor particles 36, or the like, and inhibit holes injected from the hole transport layer 30 and electrons injected from the electron transport layer 33 from passing through electrodes on opposite sides.

The insulating layer 41 and the insulating layer 42 may be formed using the same material as that of the first insulating polymer 37 or the second insulating polymer 35 described above in the first embodiment. In addition, the insulating layer 41 and the insulating layer 42 may be inorganic insulators formed of any one of aluminum oxide, magnesium oxide, silicon oxide, aluminum nitride, zirconium oxide, and hafnium oxide, and may be inorganic insulators formed of mixtures of two or more of aluminum oxide, magnesium oxide, silicon oxide, aluminum nitride, zirconium oxide, and hafnium oxide.

Additionally, the film thickness of each of the insulating layer 41 and the insulating layer 42 is preferably equal to or greater than 1 nm and equal to or less than 10 nm from the perspective of preventing the p-type semiconductor particles 34 and the n-type semiconductor particles 36 from contacting the light-emitting layer 24R including the first quantum dots and allowing carrier injection into the light-emitting layer 24R including the first quantum dots by tunneling.

Note that, in the present embodiment, a case where the insulating layer 41 is provided between the light-emitting layer 24R and the hole transport layer 30, and the insulating layer 42 is provided between the light-emitting layer 24R and the electron transport layer 33 has been described as an example. However, the disclosure is not limited thereto, and the insulating layer 41 may be provided only between the light-emitting layer 24R and the hole transport layer 30, and the insulating layer 42 may be provided only between the light-emitting layer 24R and the electron transport layer 33.

APPENDIX

The disclosure is not limited to the embodiments described above, and various modifications may be made within the scope of the claims. Embodiments obtained by appropriately combining technical approaches disclosed in the different embodiments also fall within the technical scope of the disclosure. Further, novel technical features can be formed by combining the technical approaches disclosed in each of the embodiments.

INDUSTRIAL APPLICABILITY

The disclosure can be utilized in electroluminescent elements and electroluminescent devices.

The invention claimed is:

1. An electroluminescent element comprising:
an anode;
a cathode; and
a light-emitting layer provided between the anode and the cathode,
wherein the electroluminescent element further includes
an electron transport layer including n-type semiconductor particles and a first insulating polymer, and
a hole transport layer including p-type semiconductor particles,
the electron transport layer is provided between the cathode and the light-emitting layer,
the hole transport layer is provided between the anode and the light-emitting layer,
a volume proportion of the n-type semiconductor particles in the electron transport layer is smaller than a volume proportion of the p-type semiconductor particles in the hole transport layer, and
the volume proportion of the p-type semiconductor particles in the hole transport layer is equal to or greater than 80% and equal to or less than 99.9%.

2. The electroluminescent element according to claim 1, wherein the hole transport layer further includes a second insulating polymer.

3. The electroluminescent element according to claim 1, wherein the light-emitting layer has a green light emission wavelength, and
the volume proportion of the n-type semiconductor particles in the electron transport layer is equal to or greater than 30% and equal to or less than 90%.

4. The electroluminescent element according to claim 1, wherein the light-emitting layer has a blue light emission wavelength, and
the volume proportion of the n-type semiconductor particles in the electron transport layer is equal to or greater than 40% and equal to or less than 95%.

5. The electroluminescent element according to claim 1, wherein a film thickness of the hole transport layer is equal to or greater than 10 nm and equal to or less than 200 nm.

6. The electroluminescent element according to claim 1, wherein a particle size of the n-type semiconductor particles is equal to or greater than 1 nm and equal to or less than 30 nm.

7. The electroluminescent element according to claim 1, wherein a particle size of the p-type semiconductor particles is equal to or greater than 1 nm and equal to or less than 30 nm.

8. An electroluminescent element comprising:
an anode;
a cathode; and
a light-emitting layer provided between the anode and the cathode,
wherein the electroluminescent element further includes
an electron transport layer including n-type semiconductor particles and a first insulating polymer, and
a hole transport layer including p-type semiconductor particles,
the electron transport layer is provided between the cathode and the light-emitting layer,
the hole transport layer is provided between the anode and the light-emitting layer,
a volume proportion of the n-type semiconductor particles in the electron transport layer is smaller than a volume proportion of the p-type semiconductor particles in the hole transport layer,
the light-emitting layer has a red light emission wavelength, and
the volume proportion of the n-type semiconductor particles in the electron transport layer is equal to or greater than 5% and equal to or less than 65%.

9. The electroluminescent element according to claim 8, wherein a difference between the volume proportion of the p-type semiconductor particles in the hole transport layer and the volume proportion of the n-type semiconductor particles in the electron transport layer is equal to or greater than 20%.

10. An electroluminescent device comprising:
a first electroluminescent element; and
a second electroluminescent element,
wherein the first electroluminescent element includes
a first anode,
a first cathode,
a first light-emitting layer provided between the first anode and the first cathode,
a first hole transport layer including first p-type semiconductor particles, the first hole transport layer being provided between the first anode and the first light-emitting layer, and
a first electron transport layer including first n-type semiconductor particles and a first insulating polymer, the first electron transport layer being provided between the first cathode and the first light-emitting layer,
a volume proportion of the first n-type semiconductor particles in the first electron transport layer is smaller than a volume proportion of the first p-type semiconductor particles in the first hole transport layer,
the second electroluminescent element includes
a second anode,
a second cathode,
a second light-emitting layer having a shorter light emission wavelength than the first light-emitting layer, the second light-emitting layer being provided between the second anode and the second cathode,
a second hole transport layer including second p-type semiconductor particles, the second hole transport layer being provided between the second anode and the second light-emitting layer, and
a second electron transport layer including second n-type semiconductor particles and a third insulating polymer, the second electron transport layer being provided between the second cathode and the second light-emitting layer,
a volume proportion of the second n-type semiconductor particles in the second electron transport layer is smaller than a volume proportion of the second p-type semiconductor particles in the second hole transport layer, and
a volume proportion of the second n-type semiconductor particles in the second electron transport layer is larger than the volume proportion of the first n-type semiconductor particles in the first electron transport layer.

11. The electroluminescent device according to claim 10, wherein the first p-type semiconductor particles and the second p-type semiconductor particles are the same material,
the volume proportion of the first p-type semiconductor particles in the first hole transport layer and the volume proportion of the second p-type semiconductor particles in the second hole transport layer are the same, and
the first hole transport layer and the second hole transport layer are formed of the same material as a single layer.

12. The electroluminescent device according to claim 10, wherein the first n-type semiconductor particles and the second n-type semiconductor particles are the same material, and
the first insulating polymer and the third insulating polymer are the same material.

13. The electroluminescent device according to claim 10, wherein a thickness of the first hole transport layer is equal to or greater than 10 nm and equal to or less than 200 nm, and
a thickness of the second hole transport layer is equal to or greater than 10 nm and equal to or less than 200 nm.

14. The electroluminescent device according to claim 10, wherein a particle size of the first n-type semiconductor particles is equal to or greater than 1 nm and equal to or less than 30 nm, and a particle size of the second n-type semiconductor particles is equal to or greater than 1 nm and equal to or less than 30 nm.

15. The electroluminescent device according to claim 14, wherein a particle size of the first p-type semiconductor particles is equal to or greater than 1 nm and equal to or less than 30 nm, and a particle size of the second p-type semiconductor particles is equal to or greater than 1 nm and equal to or less than 30 nm.

16. The electroluminescent device according to claim 10, wherein an insulating layer is provided at least one of between the first light-emitting layer and the first hole transport layer, between the first light-emitting layer and the first electron transport layer, between the second light-emitting layer and the second hole transport layer, or between the second light-emitting layer and the second electron transport layer.

17. The electroluminescent device according to claim 10, further comprising:
a third electroluminescent element,
wherein the third electroluminescent element includes
a third anode,
a third cathode,
a third light-emitting layer having a shorter light emission wavelength than the second light-emitting layer, the third light-emitting layer being provided between the third anode and the third cathode,
a third hole transport layer including third p-type semiconductor particles, the third hole transport layer being provided between the third anode and the third light-emitting layer, and
a third electron transport layer including third n-type semiconductor particles and a fourth insulating polymer, the third electron transport layer being provided between the third cathode and the third light-emitting layer,
a volume proportion of the third n-type semiconductor particles in the third electron transport layer is smaller than a volume proportion of the third p-type semiconductor particles in the third hole transport layer, and
the volume proportion of the third n-type semiconductor particles in the third electron transport layer is larger than the volume proportion of the second n-type semiconductor particles in the second electron transport layer.

18. The electroluminescent device according to claim 17, wherein the first light-emitting layer includes first quantum dots,
the second light-emitting layer includes second quantum dots,
the third light-emitting layer includes third quantum dots,
the second quantum dots have a shorter light emission wavelength than the first quantum dots, and
the third quantum dot have a shorter light emission wavelength than the second quantum dots.

19. The electroluminescent device according to claim 10, wherein the first light-emitting layer includes first quantum dots,
the second light-emitting layer includes second quantum dots, and
the second quantum dots have a shorter light emission wavelength than the first quantum dots.

* * * * *